US008773120B2

(12) United States Patent
Jager et al.

(10) Patent No.: US 8,773,120 B2
(45) Date of Patent: Jul. 8, 2014

(54) HIGH RESOLUTION AND HIGH PRECISION VECTOR MAGNETOMETER

(75) Inventors: Thomas Jager, Grenoble (FR); Jean-Michel Leger, Villard Bonnot (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 198 days.

(21) Appl. No.: 13/535,771

(22) Filed: Jun. 28, 2012

(65) Prior Publication Data

US 2013/0002245 A1 Jan. 3, 2013

(30) Foreign Application Priority Data

Jul. 1, 2011 (FR) ..................................... 11 55963

(51) Int. Cl.
| G01R 33/02 | (2006.01) |
| G01V 3/00 | (2006.01) |
| G01R 33/24 | (2006.01) |
| G01R 33/26 | (2006.01) |
| G01R 33/028 | (2006.01) |
| G01R 33/44 | (2006.01) |

(52) U.S. Cl.
CPC ................ G01R 33/24 (2013.01); G01R 33/26 (2013.01); G01R 33/028 (2013.01); G01R 33/44 (2013.01)
USPC .......................... 324/244.1; 324/300; 324/302

(58) Field of Classification Search
CPC ...... G01R 33/24; G01R 33/26; G01R 33/028; G01R 33/44
USPC .............. 324/244.1, 251, 261, 300, 302, 304, 324/307, 345, 207.11, 207.22, 330, 329, 324/331, 339, 346
See application file for complete search history.

(56) References Cited

U.S. PATENT DOCUMENTS 6,313,628 B1 * 11/2001 Leger ............................ 324/300
6,844,726 B2 * 1/2005 Leger et al. ................... 324/300

FOREIGN PATENT DOCUMENTS

| EP | 0 579 537 A1 | 1/1994 |
| EP | 0 964 260 A1 | 12/1999 |
| EP | 1 344 075 | 9/2003 |
| FR | 2 663 430 A1 | 12/1991 |
| FR | 2 713 347 A1 | 6/1995 |
| WO | WO 02/33434 A1 | 4/2002 |

OTHER PUBLICATIONS

Search Report issued Sep. 14, 2012 in European Patent Application No. 12 17 4067 with English translation of categories of cited documents.
O,Gravrand, et al., "On the calibration of a vectorial $^4$He pumped magnetometer", Earth Planets Space, vol. 53, No. 10, XP055017599A, Oct. 1, 2001, pp. 949-958.

* cited by examiner

*Primary Examiner* — Jermele M Hollington
*Assistant Examiner* — Raul Rios Russo
(74) *Attorney, Agent, or Firm* — Oblon, Spivak, McClelland, Maier & Neustadt, L.L.P.

(57) ABSTRACT

The present invention relates to a vector magnetometer for measuring the components of an ambient magnetic field. This vector magnetometer comprises an optically pumped scalar magnetometer (2'), a pair of conductive windings (Ex,Ey) having distinct axes (Ox, Oy) and powered by two generators (Gx, Gy) having distinct frequencies. The RF coil (56) of the scalar magnetometer and the conductive windings (Ex,Ex) are mechanically integral with a swivel support (85) mounted on swivel means. The axis of the RF coil is in the same plane as the axes Ox, Oy. The support is swivelled so that this plane is substantially orthogonal to the ambient magnetic field.

13 Claims, 4 Drawing Sheets

HIGH RESOLUTION AND HIGH PRECISION VECTOR MAGNETOMETER

TECHNICAL FIELD

The present invention relates to the field of vector magnetometers and more particularly to those that are optically pumped.

STATE OF PRIOR ART

Optically pumped scalar magnetometers have been known for several decades. They are based on the magnetic resonance between Zeeman lines, which is amplified using optical pumping. For example, in a magnetometer of this type using a helium cell ($^4$He), the helium atoms at the $1^1S_0$ level are excited at the $2^3S_1$ metastable level by means of the HF discharge. This $2^3S_1$ metastable level is divided in a Zeeman triplet in the presence of a static magnetic field. Atoms of the $2^3S_1$ level are optically pumped to the $2^3P_0$ level using a tunable laser. As a result, there is a different depletion of the different lines of the triplet, by selective excitation at the $2^3P_0$ level. The atoms thus excited come back through spontaneous emission to the $2^3S_1$ metastable level. A magnetic resonance is induced between the triplet levels by means of a RF field at the Larmor frequency. The resonance signal amplitude is amplified by the optical pumping. The resonance is observed by means of an absorption peak at the output of the cell. In practice, the RF field generator is frequency locked on the absorption peak by means of a PLL loop, and the module of the magnetic field (hence the term scalar magnetometer) is directly induced from the resonance frequency F from the Larmor relationship $B_0=F/\gamma$ where $\gamma$ is the electron gyromagnetic ratio.

A detailed description of an optically pumped scalar magnetometer will be found in the application FR-A-2 663 430 or even in the application FR-A-2 713 347.

More recently, vector magnetometers have been developed, that is devices enabling components of the magnetic field along several axes to be measured.

An exemplary vector magnetometer is described in European application EP-A-964260. This magnetometer further comprises a scalar magnetometer of the abovementioned type, three conductive windings surrounding the cell and the axes of which form an orthonormal trihedron. Each winding is excited with a distinct frequency signal, that is $F_x$ for the axis Ox, $F_y$ along the axis Oy and $F_z$ along the axis Oz. The application of a magnetic field along the axis Ox at the frequency $F_x$ changes the module $B_0$ of the field to be measured, $B_0$, by a varying amount at the frequency $F_x$. The output signal of the scalar magnetometer, which gives the field module, comprises a component at the frequency $F_x$ the amplitude of which depends on the projection of the field $B_0$ on the axis Ox. A synchronous demodulation of the light intensity signal that passed through the detector thereby enables this component to be accessed. The same is true for the other axes Oy and Oz. A detailed presentation of the measurement principle will be found in the Article by O. Gavrand et al. entitled "On the calibration of a vector $^4$He pumped magnetometer" published in Earth Planet Space, 53, pp. 949-958, 2011.

The structure of the abovementioned vector magnetometer is reminded in FIG. 1.

As mentioned above, it includes a scalar magnetometer, bounded by the broken line 2.

The scalar magnetometer comprises a cell 10 filled with helium, a laser 14 emitting a beam at a wavelength tuned to the energy difference between $2^3P_0$ and $2^3S_1$ levels of $^4$He, a polarizer 16, delivering a rectilinearly polarized beam 17, a photodetector 24 receiving the beam 18 that passed through the cell, a frequency locking circuit 21 controlling an RF frequency generator 22, a frequency estimator 26 and a HF discharge circuit 30.

The discharge circuit 30 passes the helium atoms from the $1^1S_0$ ground level to the $2^3S_1$ metastable level by means of a high frequency electrostatic discharge between two electrodes placed in the cell. The RF frequency generator supplies current to a coil 56 surrounding or placed in the vicinity of the cell 10 so as to generate a radiofrequency field within the latter. This RF field induces a magnetic resonance between the levels of the Zeeman triplet. The coil 56 and the polarizer 16 are mechanically integral, for example using a rotating contact, such that in any rotation applied to the polarizer results in a rotation with the same angle of the direction of the RF field. The coil 56 and the polarizer are further mounted such that the RF field is aligned in the direction of polarization.

A locking circuit 40 controls the motor 46 setting the angular position of the polarizer 16 and thus of the RF field. More precisely, the locking circuit 40 controls the direction of polarization, so as to obtain a maximum amplitude of the resonance signal.

In addition to the scalar magnetometer 2, the vector magnetometer comprises three conductive windings Ex, Ey, Ez, respectively swivelled along three axes Ox, Oy, Oz having substantially orthogonal directions. These windings are powered by three generators Gx, Gy, Gz, each set in a natural frequency, that is $F_x$, $F_y$ and $F_z$, respectively. These windings were represented in an offset manner for visibility reasons but in practice, they are located about the cell.

A circuit 70 processes the signal delivered by the frequency estimator 26, generally, a signal providing the module $B_0$ of the field to be measured.

The output of the frequency estimator 26 is demodulated in phase and quadrature at each of the frequencies $F_x$, $F_y$ and $F_z$. The phase demodulators are noted Dx, Dy, Dz, whereas the quadrature demodulators are noted D'x, D'y, D'z. The latter receive the phase shifting modulation signals using quarter-wave retardations 31, 32, 33 of equivalent phase shifting means.

The phase and quadrature components, at each of the frequencies $F_x$, $F_y$ and $F_z$ are provided to the calculation module 34 which deduces therefrom the $B_0$ components along the axes Ox, Oy and Oz.

The vector magnetometer illustrated in FIG. 1 gives good results, however has performances in resolution and precision much lower than the intrinsic performances of the scalar magnetometer it uses.

It will be first remembered that the resolution of a magnetometer is the smallest variation in magnetic field that it can detect whereas its precision is the standard deviation of the values measured with respect to the actual value of the magnetic field. The precision error has an accuracy component and a reliability component.

These restrictions in resolution and precision are essentially due to the fact that the modulation amplitudes of the magnetic field along the axes Ox, Oy, Oz, hereinafter called vector modulation amplitudes, cannot be selected too high, otherwise this would be detrimental to the sensor linearity and would introduce measurement distortion. Furthermore, the vector modulation amplitudes and modulation frequencies have to be selected sufficiently low to fulfil adiabatic excitation conditions. The excitation is said to be adiabatic when the resonance RF signal "sees" the effective magnetic field (ambient field plus modulated component) as a static field, in other words when the field variations are sufficiently slow with respect to the frequency width of the resonance peak.

In practice, for an ambient field to be measured in the order of 50 µT (intensity of the earth's magnetic field), the vector modulation amplitudes hardly exceed 50 nT for a modulation frequency in the order of about ten Hertz. Hence, the resolution for each of the field components is also in the order of 50 nT whereas that of the scalar magnetometer is in the order of about ten pT. The resolution of vector magnetometer is thus worsened by 3 orders of magnitude with respect to that of the corresponding scalar magnetometer. Furthermore, under the same measurement conditions, and a precision on the vector modulation amplitudes in the order of 1 pT, the precision of the vector magnetometer cannot drop below 1 nT.

The purpose of the present invention is consequently to provide a vector magnetometer having improved resolution and precision.

DESCRIPTION OF THE INVENTION

The present invention is defined by a device for measuring the components of an ambient magnetic field including:
- an optically pumped scalar magnetometer comprising a cell filled with a gas, a laser source emitting a light beam, a polarizer rectilinearly polarizing said beam along a direction of polarization, a photodetector receiving the polarized beam that passed through the cell and providing an electrical signal, a coil surrounding the cell, powered by a radiofrequency generator and the axis of which registers with said direction of polarization, frequency locking means receiving said electrical signal and locking the frequency of the radiofrequency generator to the Larmor frequency, a frequency estimator estimating the frequency of the radiofrequency signal generated by said generator, the scalar magnetometer providing a signal representative of the module of the magnetic field in which the cell is located from the frequency thus estimated;
- two conductive windings, having distinct axes, provided around the cell, respectively powered by two generators having distinct frequencies, demodulation means adapted to demodulate the signal provided by the scalar magnetometer in phase and quadrature to both distinct frequencies and to provide the spectral components of this signal at these two frequencies, calculation means determining from said spectral components and from the module of the ambient magnetic field, the components along three orthogonal axes of the ambient magnetic field; wherein:
  - both conductive windings and the coil are mechanically integral with a swivel support, the axes of both conductive windings and of the coil being located in a same plane;
  - said support is mounted on swivel means, so as to be able to swivel said plane substantially orthogonally to the direction of the ambient magnetic field.

According to an exemplary embodiment, the swivel means comprise a non-magnetic goniometer.

Alternatively, the swivel means receive a control signal depending on the intensity of the components of said magnetic field along the axes of both conductive windings.

The distinct frequencies $F_x$, $F_y$ and the amplitudes $bm_x$, $bm_y$ of the signals generated by said two generators are selected so that the products $bm_x F_x$ and $bm_y F_y$ fulfil adiabatic excitation conditions.

The axes of both conductive windings are preferably selected to be orthogonal.

The calculation means determine the components $B_x$ and $B_y$ of the ambient magnetic field on both axes of the conductive windings and deduce therefrom the component along an axis orthogonal to both preceding axes by means of the relationship $|B_z|=(B_0^2-B_x^2-B_y^2)^{1/2}$ where $B_0$ is the module of the ambient magnetic field measured.

According to a first alternative, the module of the ambient magnetic field is provided beforehand by the scalar magnetometer in the absence of power supply to both conductive windings and is stored in the calculation means.

According to a second alternative, the module of the ambient magnetic field is obtained by the calculation means from the spectral component at the zero frequency of the signal provided by the scalar magnetometer.

The spectral component at the zero frequency, $B_{eff}(0)$, can be corrected beforehand, by the calculation means, by an offset equal to $(B_x^2+B_y^2)/2B_{eff}(0)$.

The invention also relates to a method for measuring the components of an ambient magnetic field by means of the measuring device defining above, wherein:
a) the direction of the ambient magnetic field is determined, before said device is switched on, and said support is swivelled so that the plane containing the axes of the conductive windings and the axis of the coil is substantially orthogonal to the direction of the ambient magnetic field;
b) the measurement of the ambient magnetic field is conducted by means of the scalar magnetometer, after said device is switched on but in the absence of power supply to both conductive windings;
c) both conductive windings are powered by the generators having distinct frequencies;
d) the calculation means determine the components of the ambient magnetic field along the axes of both conductive windings from the spectral components, at both distinct frequencies, of the signal provided by the scalar magnetometer in step c) and deduce therefrom the component orthogonal to these two axes from the module of the ambient magnetic field obtained in step b).

Finally, the invention relates to another alternative of the method for measuring the components of an ambient magnetic field by means of the device defined above, wherein:
a) both conductive windings are powered by the generators having distinct frequencies, after said device is switched on;
b) the plane containing both axes of the conductive windings and the axis of the coil is swivelled, substantially orthogonally to the direction of the ambient magnetic field by minimizing the amplitudes of the components of the magnetic field measured along these two axes;
c) the calculation means determine the module of the ambient magnetic field from the components having a zero frequency of the signal provided by the scalar magnetometer;
d) the calculation means determine the components of the ambient magnetic field along the axes of both conductive windings from the spectral components, at both distinct frequencies, of the signal provided by the scalar magnetometer and deduce therefrom the component orthogonal to these two axes from the module of the ambient magnetic field obtained in step c).

The spectral component at the zero frequency, $B_{eff}(0)$, can be corrected beforehand by an offset equal to $(B_x^2+B_y^2)/2B_{eff}(0)$, where $B_x$ and $B_y$ are the components of the ambient magnetic field along the axes of both conductive windings.

According to an advantageous exemplary embodiment, the calculation means determine a variation in the transfer function of the scalar magnetometer as a function of the frequency, correct said spectral components, at both distinct frequencies, to compensate for this variation, the components of the ambient magnetic field being then determined from the spectral components thus corrected.

DETAILED DESCRIPTION OF PARTICULAR EMBODIMENTS

The basic principle underlying the invention is to superimpose to the ambient magnetic field to be measured a modulated field orthogonal to the latter. This configuration provides vector modulation amplitudes which are substantially higher than in the state of the art but without altering the measurement linearity because the module of the effective field then only slightly varies.

Figure 2:
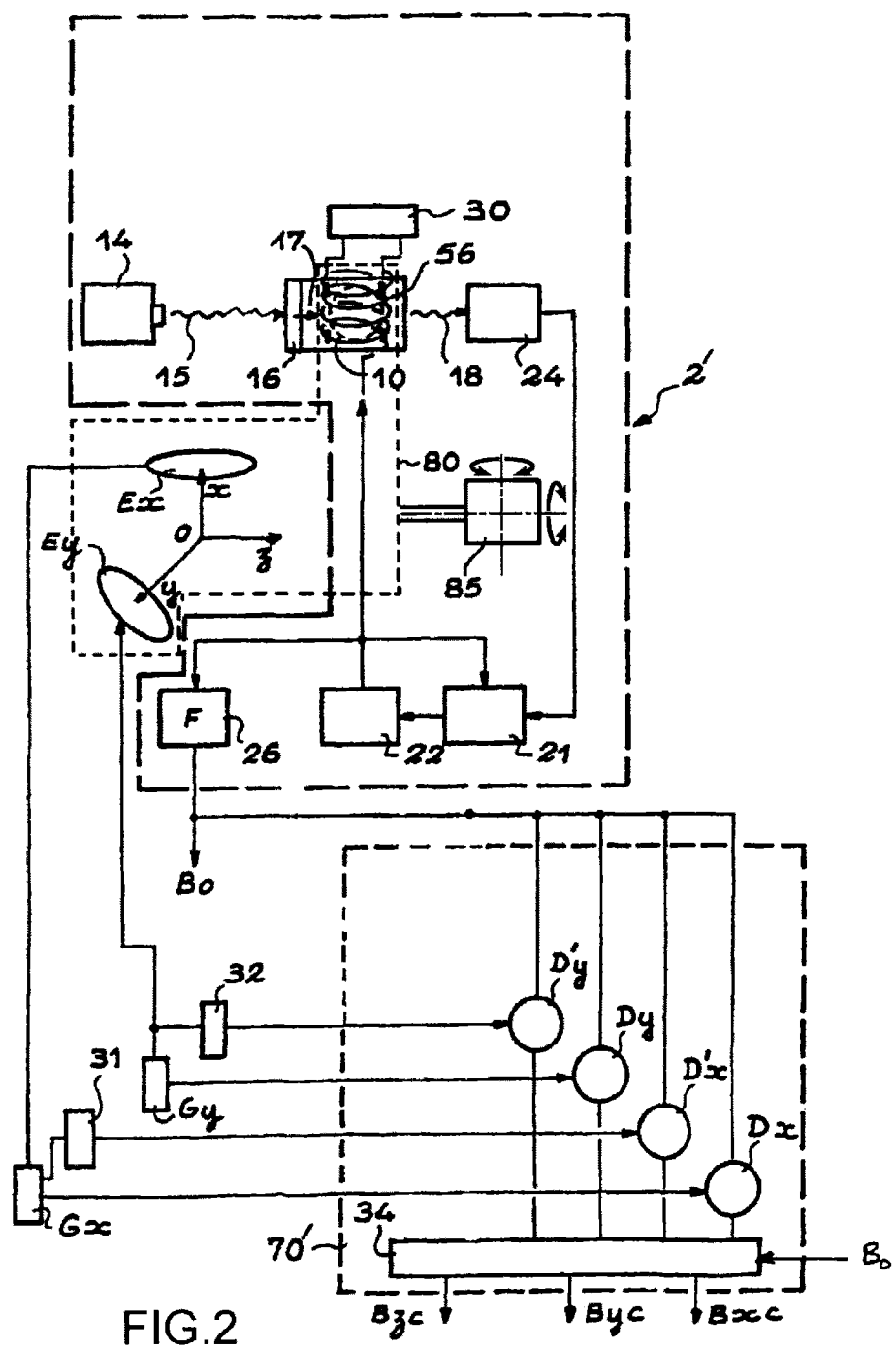
FIG. 2 schematically represents a vector magnetometer according to an embodiment of the invention.

FIG. 2 represents a vector magnetometer according to an embodiment of the invention.

Figure 1:
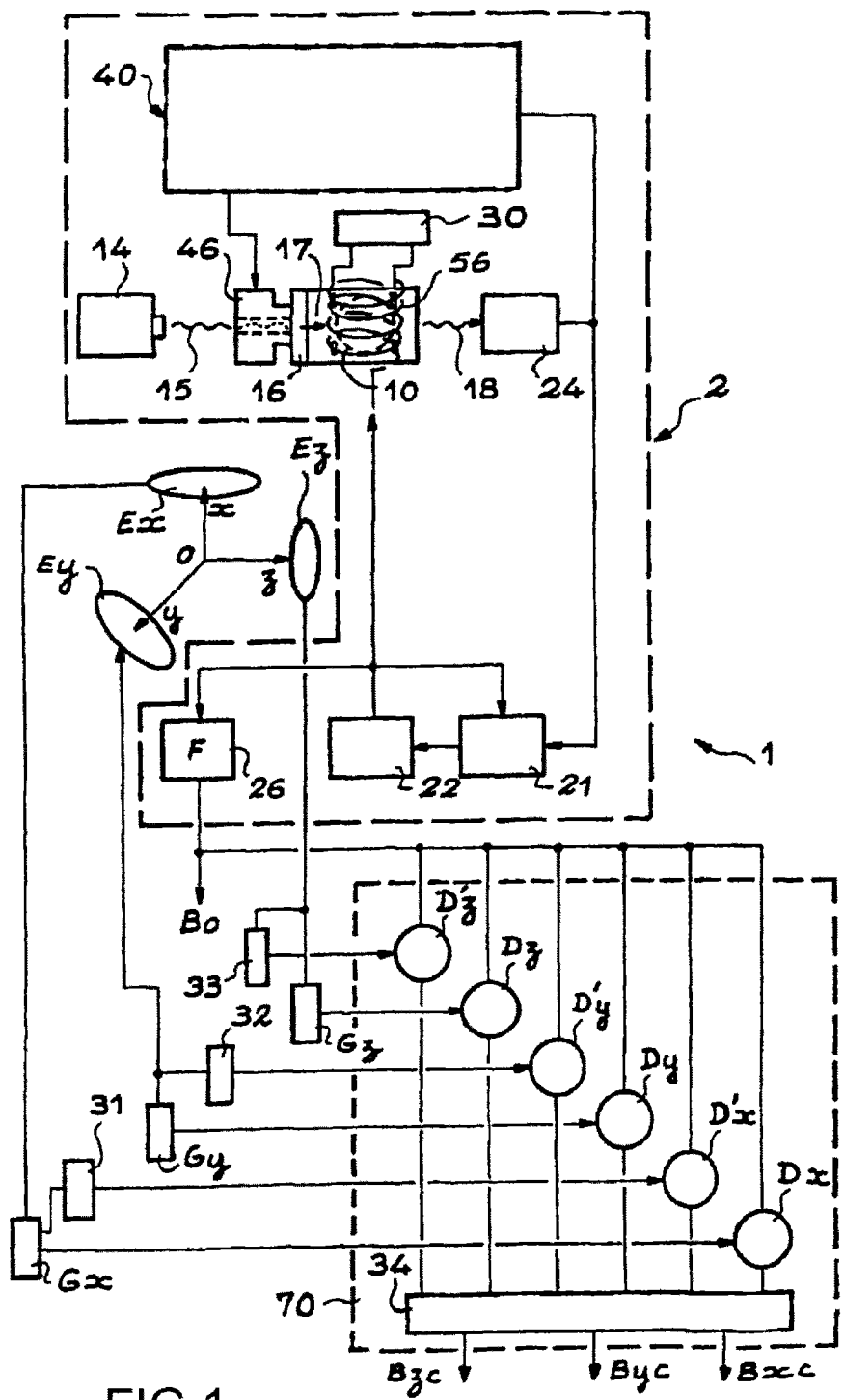
FIG. 1 represents a vector magnetometer known in the state of the art.

This magnetometer is based as before on an optically pumped scalar magnetometer 2'. Elements having the same reference numbers as in FIG. 1 are identical or similar.

The scalar magnetometer 2' includes as before a tunable laser 14, a polarizer 16, a cell 10 filled with a gas, for example helium, a photodetector 24 receiving the polarized laser beam that passed through the cell 10, a discharge circuit 30 passing the gas atoms to an excited level (in the case of helium at the $2^3S_1$ metastable level) by means of a high frequency electrostatic discharge, a frequency locking circuit 21 receiving the electric signal from the photodetector and driving the frequency of the RF generator 22 powering the coil. The locking is performed under the absorption peak of the cell the corresponding frequency is the Larmor frequency associated with the magnetic field in which it is located.

The structure of the scalar magnetometer 2' is however simpler than that of the scalar magnetometer 2. Indeed, this does not have any motor 46 varying the polarization of the laser beam at the input of the cell 10, and consequently any locking circuit 40.

The polarizer 16 is fixed with respect to the coil 56 and delivers a rectilinear polarized beam having as a direction of polarization the axis thereof. In other words, the RF field exciting gas atoms registers with the direction of polarization of the incident laser beam.

The scalar magnetometer 2' provides a signal representative of the module of the magnetic field in which the cell (for example the corresponding Larmor frequency) is located.

Unlike FIG. 1, the vector magnetometer herein only includes two conductive windings Ex and Ey intended to modulate the magnetic field applied to the cell.

The axes Ox, Oy of both conductive windings Ex and Ey are distinct and advantageously selected to be orthogonal.

The axis of the coil 56 (consequently the direction of the RF field) and the axes Ox, Oy are located in a same plane.

The generators Gx and Gy power the conductive windings Ex and Ey with periodical signals, typically sinusoidal signals, having distinct frequencies $F_x$ and $F_y$, hereinafter called vector modulation signals. As before, these signals are also used to perform a phase and quadrature demodulation of the measurement signal from the scalar magnetometer. The calculation module 34 of the processing circuit 70' receives the phase and quadrature components demodulated at the frequencies $F_x$ and $F_y$. In a previous step, the calculation module 34 stored beforehand in memory the module of the ambient field $B_0$ as explained later.

The components $B_x$ and $B_y$ are obtained from the spectral components of the field intensity, at the frequencies $F_x$ and $F_y$, as in prior art. On the other hand, the third component is deduced from the relationship:

$$|B_z| = (B_0^2 - B_x^2 - B_y^2)^{1/2} \quad (1)$$

The coil 56 and windings Ex and Ey form an assembly 80, mechanically integral with a swivel support 85. This support is mounted on swivel means (not shown), either mechanical or electromechanical, for swivelling and maintaining the axes of the conductive windings Ex and Ey, as well as the direction of the RF field, in a plane substantially orthogonal to the ambient magnetic field.

According to an exemplary embodiment, the swivel means can be a non-magnetic goniometer. This device neither generates nor disturbs the ambient magnetic field. It provides the angular swivelling of the magnetic field and enables the support to be swivelled in the direction thereof.

The swivel means can be driven by a control signal, being external or not to the vector magnetometer, indicating the direction of the ambient magnetic field. For example, this control signal can be provided by an angular magnetometer. Alternatively, this control signal can be generated by the vector magnetometer itself, during a coarse calibration phase, as explained later.

In any case, the swivelling of the support in the direction of the magnetic field can be performed with a relatively coarse precision, of 1% to 0.1%, preferably equal to 0.1%. It is important to understand that the aim of this swivelling is to be under low distortion level measurement conditions, and not to precisely know the swivelling of the ambient magnetic field. The precise swivelling of the latter is in turn given by the measurement of the components of the ambient field.

The effective magnetic field, that is actually applied to the cell, can be represented by:

$$B_{eff} = B_0 + bm_x e^{j2\pi F_x t} + bm_y e^{j2\pi F_y t} \quad (2)$$

where $B_0$ is the magnetic vector of the ambient field, $bm_x e^{j2\pi F_x t}$ and $bm_y e^{j2\pi F_y t}$ are respectively the magnetic fields generated by the conductive windings Ex and Ey. The vectors $bm_x$ and $bm_y$ are substantially orthogonal to $B_0$ such that the end of the vector $B_{eff}$ travels an ellipse in the plane Oxy. $bm_x = bm_y$ will be further advantageously selected to minimize distortion. The amplitudes $bm_x = \|bm_x\|$ and $bm_y = \|bm_y\|$ are advantageously selected from one to two orders of magnitude lower than the amplitude of the ambient field $B_0$ (for modulation frequencies of a few Hz to 20 Hz), that is at levels 10 to 100 times higher than that used in prior art. Since the intensity $B_{eff}$ of the effective field only slightly varies over time, the magnetometer remains in a linear range and a resolution and a precision of the measurement of the field vector components, being 10 to 100 times better than that of prior art, can be achieved.

The products $bm_x F_x$ and $bm_y F_y$ are further selected sufficiently low (lower than $10^{-5}$ or even $10^{-6}$ T.Hz) to remain in an adiabatic excitation regime. For modulation frequencies lower than 20 Hz, fulfilling this criterion is translated by an upper bound of the amplitudes $bm_x$ and $bm_y$ in the order of one thousand of the intensity of the ambient field. For example, for the measurement of the earth magnetic field, $bm_x=bm_y=1$ nT, $F_x=20$ Hz and $F_y=9$ Hz could be taken.

The measurement of the components $bm_x$ and $bm_y$ can be used in a coarse calibration phase for swivelling the support. In such a case, a control signal is generated so as to minimize $b_\perp=(B_x^2+B_y^2)^{1/2}$, that is to swivel the axes Ox and Oy orthogonally to the ambient field.

Figure 3:
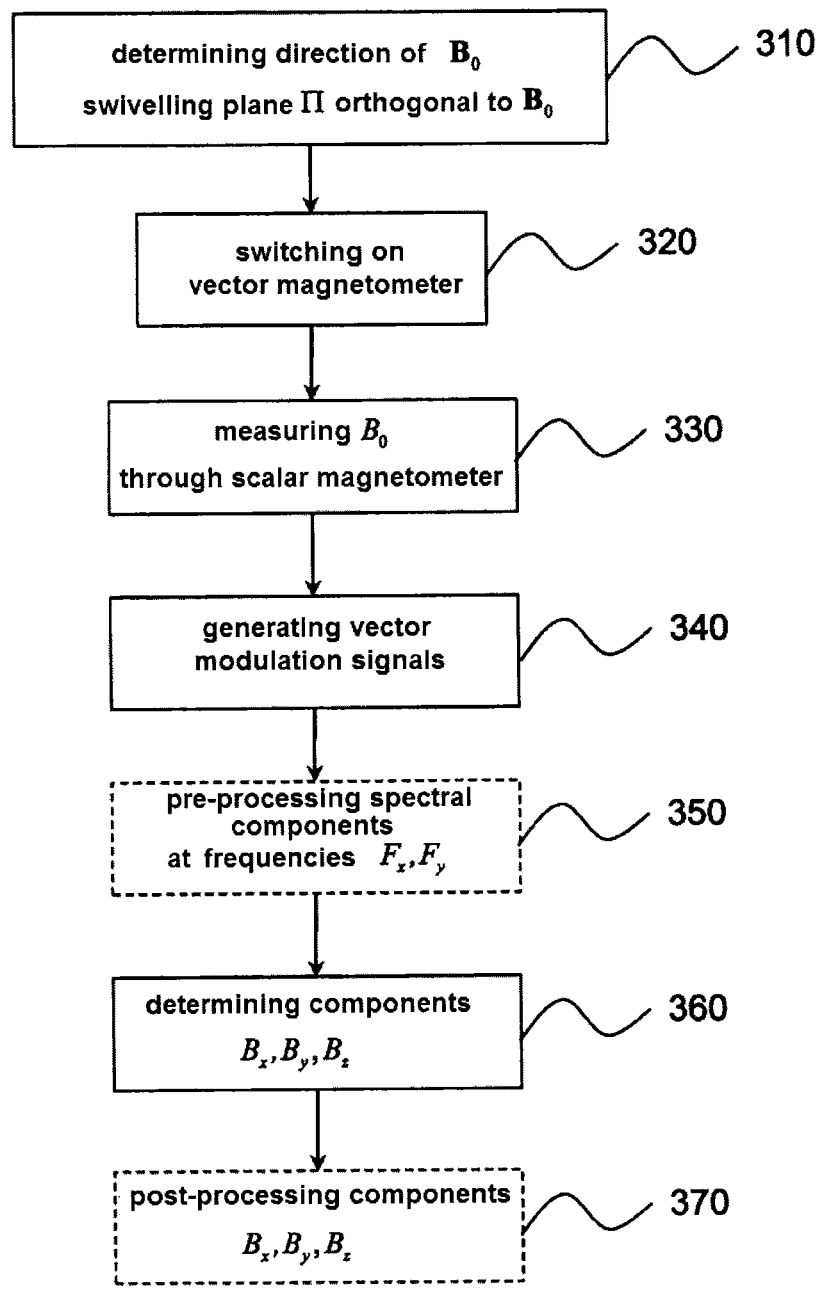
FIG. 3 schematically represents a method for measuring the components of the ambient magnetic field by means of the magnetometer of FIG. 2, according to a first alternative of the invention.

FIG. 3 schematically represents a method for measuring the components of the ambient magnetic field by means of the vector magnetometer of FIG. 2, according to a first alternative of the invention.

In a first step 310, before the vector magnetometer is switched on to avoid any electromagnetic disturbance, the direction of the ambient magnetic field $B_0$ is determined using the non-magnetic goniometer and the support 85 is swivelled so that the plane Π containing the axis of the coil 56 and the axes Ox, Oy of both conductive windings is orthogonal to the ambient magnetic field.

After the vector magnetometer is switched on in 320, but in the absence of vector modulation signal generation, the module $B_0$ of the ambient magnetic field is measured in 330 by the scalar magnetometer 2' and stored in the calculation means 34 for a subsequent use.

In step 340, the generators Gx and Gy are activated and inject the vector modulation signals into the conductive windings Ex and Ey respectively.

In step 360, the components $B_x$, $B_y$ of the ambient field are determined from the spectral components of $B_{eff}$ at the frequencies $F_x$ and $F_y$ and the component $B_z$ is deduced therefrom thanks to the relationship (1) from the module $B_0$ obtained in step 330.

Alternatively, according to an alternative not represented, the measurement $B_0$ is not performed during a distinct step 330, prior to vector modulation signal generation, but simultaneously to the determination of the components $B_x$, $B_y$, in step 360. According to this alternative, the module $B_0$ is obtained by the DC components of the signal representative of $B_{eff}$, provided by the frequency estimator 26. The module $B_0$ is thus given by the spectral component of $B_{eff}$ at the zero frequency.

Whatever the alternative, various pre-processings or post-processings can be contemplated in the calculation means.

For example, the calculation means can optionally correct in step 350 the spectral components to take account of the evolution in the transfer function of the scalar magnetometer as a function of the frequency, as explained in patent EP-B-1 344 075. The spectral components of $B_{eff}$ are then compensated for the variation in the transfer function prior to obtaining the components $B_x$, $B_y$, wherein the component $B_z$ is deduced from the relationship (1) as above.

Further, when the module $B_0$ is obtained by means of the DC spectral component of $B_{eff}$, this can be advantageously corrected so as to compensate for the beating of the components at the frequency $F_x$, $F_y$ with themselves. Indeed, this beating induces a stray component at the zero frequency, having an intensity substantially equal to $b_m^2/2B_0$. The module $B_0$ is then estimated no longer as $B_{eff}(0)$ but is corrected as follows:

$$B_0 = B_{eff}(0) - (B_x^2 + B_y^2)/2B_{eff}(0) \quad (3)$$

$$B_0 = B_{eff}(0) - (B_x^2 + B_y^2)/2B_{eff}(0) \quad (3)$$

where $B_{eff}(0)$ is the DC component of the spectrum of $B_{eff}$.

Optionally, in 370, a transformation of the components $B_x$, $B_y$, $B_z$ can be provided to obtain components in an orthonormal referential of the magnetometer, not related to the support. Further processings using a calibration, a filtering of successive measurements to improve the signal to noise ratio can also be contemplated without departing from the scope of the present invention.

Figure 4:
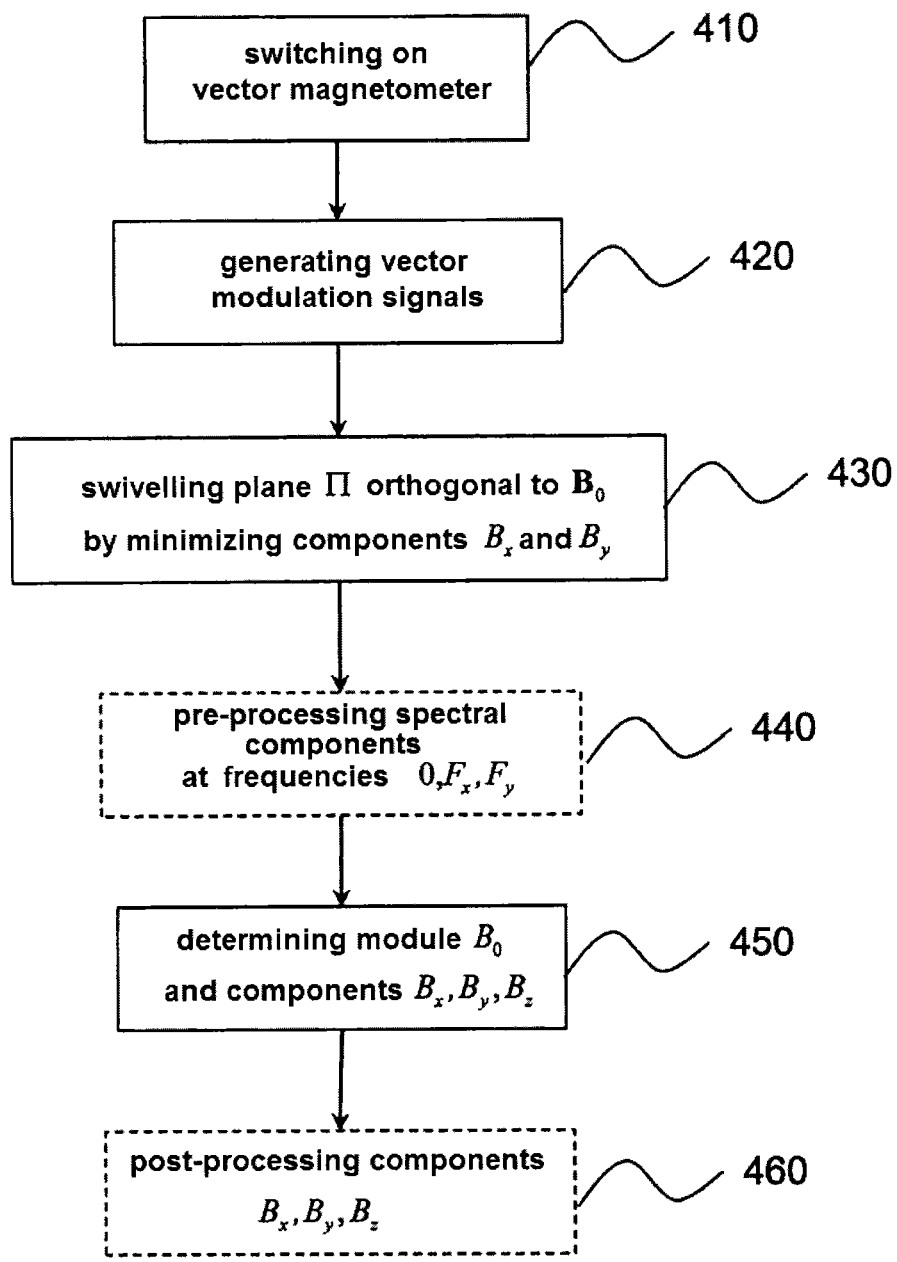
FIG. 4 schematically represents a method for measuring the components of the ambient magnetic field by means of the magnetometer of FIG. 2, according to a second alternative of the invention.

FIG. 4 schematically represents a method for measuring the components of the ambient magnetic field by means of the vector magnetometer of FIG. 2, according to a second alternative of the invention.

After the vector magnetometer is switched on in 410, the vector modulation signals are generated by Gx and Gy and injected into the conductive windings Ex and Ey, in 420.

The support 85 is swivelled in 430, so as to minimize the components $B_x$ and $B_y$ or, equivalently, the transverse component $B_\perp$.

The DC components at the frequencies $F_x$, $F_y$ are optionally pre-processed in step 440. The pre-processing of the DC component can be the correction expressed by the relationship (3). The components at the frequencies $F_x$, $F_y$ can undergo the same processing as that of step 350 already described.

In 450, the determination of the module $B_0$ and the components $B_x$, $B_y$ is conducted from the spectral components at the frequencies 0, $F_x$, $F_y$, respectively, corrected or not beforehand in 440, and the component $B_z$ is deduced from the relationship (1).

Finally, a post-processing of the components $B_x$, $B_y$, $B_z$ is optionally conducted as described in connexion with step 370.

The invention claimed is:

1. A device for measuring the components of an ambient magnetic field including:

an optically pumped scalar magnetometer comprising a cell filled with a gas, a laser source emitting a light beam, a polarizer rectilinearly polarizing said beam along a direction of polarization, a photodetector receiving the polarized beam that passed through the cell and providing an electrical signal, a coil surrounding the cell, powered by a radiofrequency generator and the axis of which registers with said direction of polarization, frequency locking means receiving said electrical signal and locking the frequency of the radiofrequency generator to the Larmor frequency, a frequency estimator estimating the frequency of the radiofrequency signal generated by said generator, the scalar magnetometer providing a signal representative of the module of the magnetic field in which the cell is located from the frequency thus estimated;

two conductive windings (Ex, Ey), having distinct axes (Ox, Oy), provided around the cell, respectively powered by two generators (Gx, Gy) having distinct frequencies ($F_x$, $F_y$), demodulation means (Dx,D'x; Dy,D'y) adapted to demodulate the signal provided by the scalar magnetometer in phase and quadrature to both distinct frequencies and to provide the spectral components of said signal at said two frequencies, calculation means determining from said spectral components and from the module of the ambient magnetic field, the components along three orthogonal axes (Ox,Oy,Oz) of the ambient magnetic field;

wherein:
both conductive windings (Ex,Ey) and the coil are mechanically integral with a swivel support, the axes of both conductive windings and of the coil being located in a same plane;
said support is mounted on swivel means, so as to be able to swivel said plane substantially orthogonally to the direction of the ambient magnetic field.

2. The measuring device according to claim 1, wherein the swivel means comprise a non-magnetic goniometer.

3. The measuring device according to claim 1, wherein the swivel means receive a control signal depending on the intensity of the components of said magnetic field along the axes of both conductive windings.

4. The measuring device according to claim 1, wherein distinct frequencies $F_x, F_y$ and amplitudes $bm_x, bm_y$ of the signals generated by said two generators are selected so that the products $bm_x F_x$ and $bm_y F_y$ fulfil adiabatic excitation conditions.

5. The measuring device according to claim 1, wherein the axes of both conductive windings are orthogonal.

6. The measuring device according to claim 5, wherein the calculation means determine components $B_x$ and $B_y$ of the ambient magnetic field on both axes (Ox,Oy) of the conductive windings and deduce therefrom the component along an axis (Oz) orthogonal to both preceding axes by means of the relationship $|B_z|=(B_0^2-B_x^2-B_y^2)^{1/2}$ where $B_0$ is the module of the ambient magnetic field measured.

7. The measuring device according to claim 6, wherein the module of the ambient magnetic field is provided beforehand by the scalar magnetometer in the absence of power supply to both conductive windings and is stored in the calculation means.

8. The measuring device according to claim 6, wherein the module of the ambient magnetic field is obtained by the calculation means from the spectral component at the zero frequency of the signal provided by the scalar magnetometer.

9. The measuring device according to claim 8, wherein the spectral component at the zero frequency, $B_{eff}(0)$, is corrected beforehand, by the calculation means, by an offset equal to $(B_x^2+B_y^2)/2B_{eff}(0)$.

10. A method for measuring the components of an ambient magnetic field by means of the measuring device of claim 1, wherein:
a) the direction of the ambient magnetic field is determined, before said device is switched on, and said support is swivelled so that the plane containing the axes of the conductive windings and the axis of the coil is substantially orthogonal to the direction of the ambient magnetic field;
b) the measurement of the ambient magnetic field is conducted with the scalar magnetometer, after said device is switched on but in the absence of power supply to both conductive windings;
c) both conductive windings are powered by the generators having distinct frequencies ($F_x$, $F_y$);
d) the calculation means determine the components of the ambient magnetic field along the axes of both conductive windings from the spectral components, at both distinct frequencies, of the signal provided by the scalar magnetometer in step c) and deduce therefrom the component orthogonal to said two axes from the module of the ambient magnetic field obtained in step b).

11. A method for measuring the components of an ambient magnetic field with the measuring device of claim 1, wherein:
a) both conductive windings are powered by the generators having distinct frequencies ($F_x$, $F_y$) after said device is switched on;
b) the plane (Π) containing both axes of the conductive windings and the axis of the coil is swivelled, substantially orthogonally to the direction of the ambient magnetic field by minimizing the amplitudes of the components of the magnetic field measured along said two axes;
c) the calculation means determine the module of the ambient magnetic field from the components having a zero frequency of the signal provided by the scalar magnetometer;
d) the calculation means determine the components of the ambient magnetic field along the axes of both conductive windings from the spectral components, at both distinct frequencies, of the signal provided by the scalar magnetometer and deduce therefrom the component orthogonal to said two axes from the module of the ambient magnetic field obtained in step c).

12. The measuring method according to claim 11, wherein the spectral component at the zero frequency, $B_{eff}(0)$, is corrected beforehand by an offset equal to $(B_x^2+B_y^2)/2B_{eff}(0)$, where $B_x$ and $B_y$ are the components of the ambient magnetic field along the axes of both conductive windings.

13. The measuring method according to claim 10, wherein the calculation means determine a variation in the transfer function of the scalar magnetometer as a function of the frequency, correct said spectral components, at both distinct frequencies, to compensate for said variation, the components of the ambient magnetic field being then determined from the spectral components thus corrected.

* * * * *